United States Patent
Ko et al.

(10) Patent No.: US 6,844,223 B2
(45) Date of Patent: Jan. 18, 2005

(54) SEMICONDUCTOR DEVICE HAVING SILICON ON INSULATOR AND FABRICATING METHOD THEREFOR

(75) Inventors: Young-Gun Ko, Seoul (KR); Byung-Sun Kim, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/738,724
(22) Filed: Dec. 17, 2003
(65) Prior Publication Data

US 2004/0132234 A1 Jul. 8, 2004

Related U.S. Application Data

(62) Division of application No. 09/640,851, filed on Aug. 17, 2000, now Pat. No. 6,693,325.

(30) Foreign Application Priority Data

Oct. 5, 1999 (KR) .............................. 99-42801

(51) Int. Cl.⁷ ............................................. H01L 21/00
(52) U.S. Cl. ...................... 438/152; 438/164; 438/237
(58) Field of Search ................................. 438/152, 164, 438/237

(56) References Cited

U.S. PATENT DOCUMENTS

| | | | | |
|---|---|---|---|---|
| 6,303,414 B1 | * | 10/2001 | Ang et al. | 438/155 |
| 6,406,948 B1 | * | 6/2002 | Jun et al. | 438/152 |
| 2002/0053717 A1 | * | 5/2002 | Sumida | 257/565 |

* cited by examiner

Primary Examiner—Trung Dang
(74) Attorney, Agent, or Firm—Mills & Onello, LLP (57) ABSTRACT

The present invention relates to a highly integrated SOI semiconductor device and a method for fabricating the SOI semiconductor device by reducing a distance between diodes or well resistors without any reduction in insulating characteristics. The device includes a first conductivity type semiconductor substrate and a surface silicon layer formed by inserting an insulating layer on the semiconductor substrate. A trench is formed by etching a predetermined portion of surface silicon layer, insulating layer and substrate to expose a part of the semiconductor substrate to be used for an element separating region, and a STI is formed in the trench. A transistor is constructed on the surface silicon layer surrounded by the insulating layer and STI with a gate electrode being positioned at the center thereof and with source/drain region being formed in the surface silicon layer of both edges of the gate electrode for enabling its bottom part to be in contact with the insulating layer. A first groove is formed between the STI at one side of the transistor by etching the surface silicon layer and insulating layer to expose a predetermined portion of an active region of a second conductivity type well in the semiconductor substrate. A second groove is formed between the STI at one side of the first groove by etching the surface silicon layer and insulating layer to expose a predetermined portion of the active region of the semiconductor substrate. A first diode diffusion region of a first conductivity type is formed in a second conductivity type well under the first groove, and a second diode diffusion region of a second conductivity type is formed in the semiconductor substrate under the second groove.

15 Claims, 14 Drawing Sheets

SEMICONDUCTOR DEVICE HAVING SILICON ON INSULATOR AND FABRICATING METHOD THEREFOR

RELATED APPLICATIONS

This application is a divisional of U.S. application Ser. No. 09/640,851, filed on Aug. 17, 2000, now U.S. Pat. No. 6,693,325 the contents of which are incorporated herein in their entirety by reference.

BACKGROUND OF THE INVENTION

1. Field of the Invention

The present invention relates to a semiconductor device and a method for fabricating the semiconductor device, and more particularly to a semiconductor device having silicon on insulator (SOI) and a fabricating method therefor, by which a distance between a diode and a well resistor of the SOI semiconductor device is shortened to achieve high integration without degradation in insulating characteristics in the device.

2. Description of the Prior Art

Recently, great attention has been drawn to the SOI technique, in which a monocrystalline silicon layer is formed on an insulating layer to integrate semiconductor unit elements. If the SOI technique is applied to fabricating a semiconductor device, it can reduce junction capacitance in driving the semiconductor device, so as to improve its operational speed compared with a general bulk semiconductor device.

However, due to a structural characteristic of the SOI semiconductor device, a silicon substrate and a unit device formed thereon are completely separated by an insulating layer, commonly referred to as a buried oxide (BOX) layer. As a result, a unit element like a diode is typically formed as a lateral element for integrating electronic circuits on the SOI substrate, causing a limitation in use of a well structured element such as a resistor for integrated circuits. As a result, the diode has not been made in the vertical NPN (or PNP) structure commonly used for an electro static discharge (ESD) circuit or the like, causing difficulty in fabricating an integrated circuit.

If a vertical NPN (or PNP) diode is replaced by lateral NPN (or PNP) diode, the driving capacity is reduced to approximately half. Therefore, it is necessary to fabricate the unit element (diode) of the vertical NPN structure twice as large as that of the horizontal NPN structure to compensate for this disadvantage. Accordingly, the area is also proportionally required for fabricating a larger unit element, resulting in a negative effect on the integration level of the highly integrated circuit.

Therefore, in order to allow such a unit element to be fabricated in the same structure within the same area as used for a conventional semiconductor device, the SOI semiconductor device is fabricated by selectively etching a predetermined portion of the upper silicon layer and BOX layer, and forming the unit elements inside a lower silicon layer.

Figure 1:
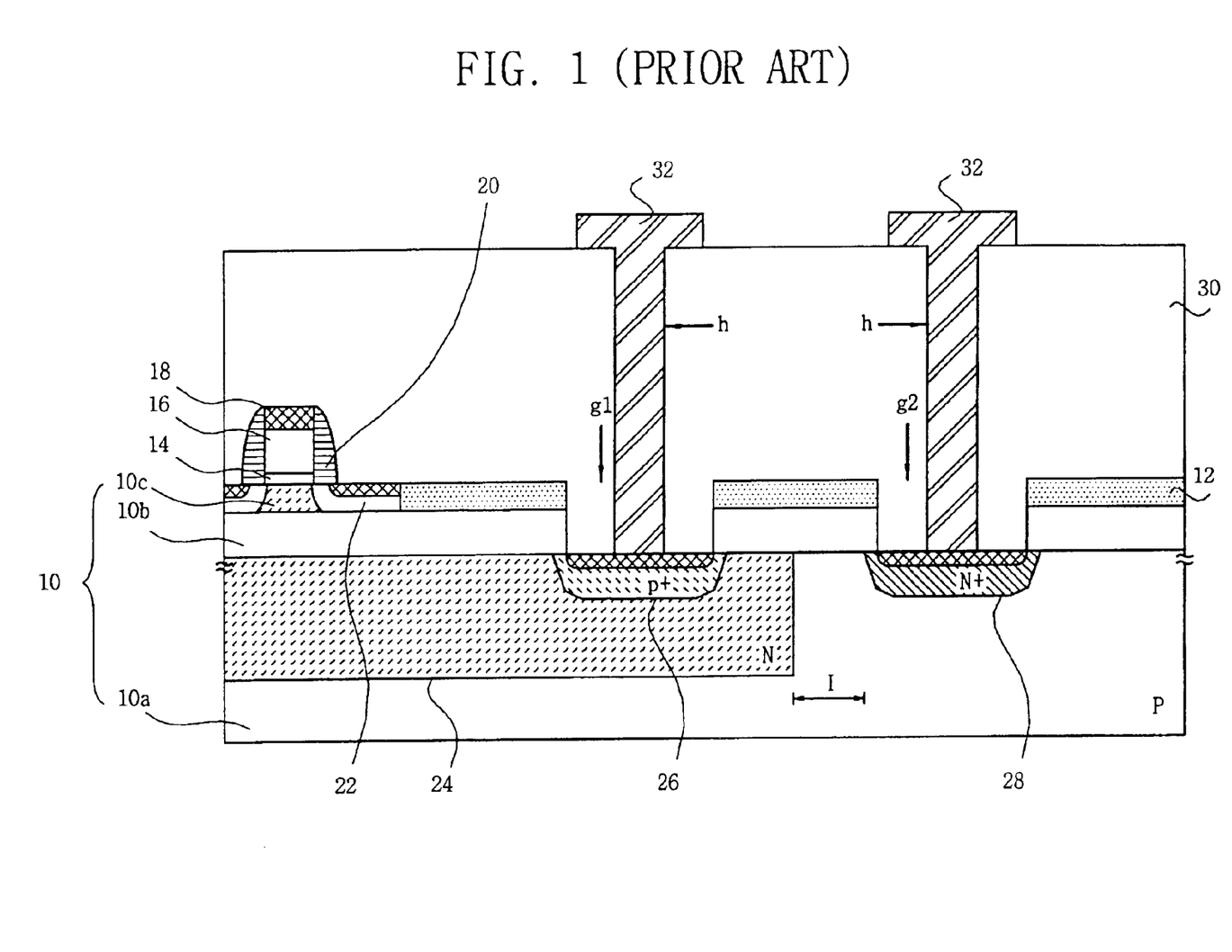
FIG. 1 is a cross-sectional view illustrating a conventional SOI semiconductor device.

FIG. 1 is a cross-sectional view illustrating a conventional structure of a SOI semiconductor device fabricated according to the aforementioned method. The conventional structure of FIG. 1 includes a semiconductor device having a diode.

According to the cross-sectional view in FIG. 1, the conventional SOI device includes a SOI substrate having a surface silicon layer 10c formed by inserting an insulating layer 10b on a P type semiconductor substrate 10a. An element separating layer 12 is formed at a predetermined portion (an element separating region) of the surface silicon layer 10c for enabling its bottom surface to contact the insulating layer 10b. A gate electrode 16 is formed by inserting a gate insulating layer 14 at a predetermined portion of the surface silicon layer 10c. An insulating spacer 20 is formed at both side walls of the gate electrode. A source/drain region 22 is formed in the surface silicon layer 10c at both edges of the gate electrode 16 for enabling its bottom part to contact the insulating layer 10b. A first groove (g1) formed at one side of the gate electrode 16 for penetrating the surface silicon layer 10c and insulating layer 10b to expose a predetermined portion of an active region of a N well 24 formed inside the semiconductor substrate 10a. A P type first diffusion region 26 is formed inside the N well 24 at the bottom of the first groove (g1). A second groove (g2) is formed at one side of the first diffusion region 26 by penetrating the surface silicon layer 10c and insulating layer 10b to expose a predetermined portion of the active region of the silicon substrate 10. A N+ type second diffusion region 28 is formed in the silicon substrate 10a under the second groove (g2). An interlevel insulating layer 30 having a plurality of contact holes (h) is formed on the resultant structure to expose a predetermined portion of the surface of the first and second diffusion regions 26, 28. Metal wires 32 are formed for separately connecting the first and second diffusion regions 26, 28. Item 18 is a silicide layer formed for reducing voltage levels of the gate electrode and contact wires.

Accordingly, in case of the SOI device thus constructed, a surface silicon layer 10c surrounded by insulating layer 10b and device separating layer 12 is used for a transistor channel region, the first diffusion region 26 and N well 24 for P+/N diode, and the second diffusion region 28 and P type silicon substrate 10a for N+/P diode.

However, there are several drawbacks to the SOI device thus constructed. The distance I between the N well 24 formed for the P+/N diode and the second diffusion region 28 formed for the N+/P diode is reduced enough to allow the N well 24 and the second diffusion region 28 to meet each other in the silicon substrate 10a. At this time, the silicon substrate 10a does not have a function for separation to thereby reduce the operational property of the semiconductor device. Therefore, it is very important to secure a sufficient distance between those diodes of the SOI semiconductor device constructed in the structure shown in FIG. 1. Therefore, there are problems in the conventional method for fabricating the SOI semiconductor device in that there is given a limitation in shortening the distance between diodes for fabricating a highly integrated semiconductor device according to designing rules.

SUMMARY OF THE INVENTION

Therefore, it is an object of the present invention to solve the aforementioned problems and provide a SOI semiconductor device by modifying its structure of separating P+/N diode from N+/P diode with STI at the semiconductor substrate in the process of designing the SOI device, so that, however short the distance between diodes may be, an actual distance between those diodes in the silicon substrate, that is, an effective distance for separation, is large enough to make no difference in the insulating property and achieve the same operational level of the integrated circuit as the conventional SOI device, even if the SOI device is fabricated in an area smaller than that required for the conventional SOI device.

It is another object of the present invention to provide a method for effectively fabricating a SOI semiconductor device of the present invention.

In order to accomplish the aforementioned objects of the present invention, there is provided a SOI semiconductor device of the present invention which includes a semiconductor substrate of a first conductivity type. A surface silicon layer is formed by inserting an insulating layer on the semiconductor substrate. A trench is formed by etching a predetermined portion of surface silicon layer, insulating layer and substrate to expose a part of the semiconductor substrate to be used for an element separating region, and a STI is formed in the trench. A transistor is constructed on the surface silicon layer surrounded by the insulating layer and STI with a gate electrode being positioned at the center thereof and with a source/drain region being formed in the surface silicon layer of both edges of the gate electrode for enabling its bottom part to be in contact with the insulating layer. A first groove is formed between the STI at one side of the transistor by etching the surface silicon layer and insulating layer to expose a predetermined portion of an active region of a second-conductivity-type well in the semiconductor substrate. A second groove is formed between the STI at one side of the first groove by etching the surface silicon layer and insulating layer to expose a predetermined portion of the active region of the semiconductor substrate. A first diode diffusion region of the first conductivity type is formed in a second-conductivity-type well under the first groove. A second diode diffusion region of a second conductivity type is formed in the semiconductor substrate under the second groove.

In one embodiment, the device can include another first-conductivity-type well in the semiconductor substrate under the second groove to allow the second diode diffusion region to form in the second first-conductivity-type well. The device can also be constructed with a first-conductivity-type impurity doping region which contacts the second-conductivity-type well under the STI positioned between the second-conductivity-type well and the second diode diffusion region. If necessary, a semiconductor device can be fabricated with both of the aforementioned elements.

In order to accomplish the second object of the present invention, there is provided a method for fabricating a SOI semiconductor device. A surface silicon layer is formed by inserting an insulating layer on the first-conductivity-type semiconductor substrate. An etch stopper layer and oxide layer are sequentially formed on the surface silicon layer. The oxide layer and etch stopper layer are selectively etched to expose a predetermined portion of the surface silicon layer to be used for an element separating region. A trench is formed using the etched oxide layer as a mask to sequentially etch a predetermined thickness of surface silicon layer, insulating layer and semiconductor substrate. An insulating layer is sequentially formed to fill the trench and a STI formed in the trench by performing a CMP treatment such that the etch stopper layer is at a predetermined thickness. The remaining etch stopper layer is removed. A predetermined portion of the inner part of the surface silicon layer is doped by selectively ion-implanting a second-conductivity-type impurity to form a first transistor and, at the same time, form a second-conductivity-type well in the semiconductor substrate thereunder. A gate electrode is formed by forming a gate insulating layer on the surface silicon layer at the top of the second-conductivity-type well. Spacers are formed at both lateral walls of the gate electrode. First and second grooves are formed by selectively etching the surface silicon layer and insulating layer to expose the surface of the second-conductivity-type well at one side of the gate electrode and that of the semiconductor substrate, both of which are positioned apart at a predetermined distance with the STI being formed therebetween. A source/drain region is formed in the surface silicon layer at both edges of the gate electrode by selectively ion-implanting a high density of the first-conductivity-type impurity where a first transistor is formed. The bottom portion of the source/drain region contacts the insulating layer. A first diode diffusion region is formed in the second-conductivity-type well under the first groove. A second diode diffusion region is formed in the semiconductor substrate under the second groove by selectively ion-implanting a high density of the second-conductivity-type impurity into a part where a second transistor is formed.

In a first additional embodiment, after formation of the second-conductivity-type well, a first-conductivity-type impurity is selectively ion-implanted to a part, where a second transistor will be formed, thereby doping a predetermined portion of the surface silicon layer with the first-conductivity-type impurity and, at the same time, forming the first-conductivity-type well in the semiconductor substrate thereunder.

In a second additional embodiment, immediately after formation of the second-conductivity-type well, a field ion-implanting process is performed to form another first-conductivity-type impurity doping region which contacts the second-conductivity-type well under the STI between the second-conductivity-type well and the second diode diffusion region.

In one embodiment, after formation of the second-conductivity-type well, the first-conductivity-type well is formed according to the process described above in the first additional embodiment, and another first-conductivity-type impurity doping region is formed at a predetermined portion under the STI to contact the second-conductivity-type well according to the process described above in the second additional embodiment.

If the SOI semiconductor device is constructed as described above, the SOI device is designed in the structure where the first and second diode diffusion regions are insulated by the STI in the semiconductor substrate. Therefore, even if the distance between the diffusion regions may be shorter in the present invention than in the prior art, an actual distance between those regions in the silicon substrate, that is, an effective distance for separation, is made larger. As a consequence, the fabricating approach of the present invention makes it possible to achieve the same operational function of the SOI semiconductor device of the present invention as the conventional one, even if the SOI device of the present invention is fabricated in an area smaller than that which has been required for the conventional one.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 3a through 3l are sequential schematic cross-sectional views illustrating a method for fabricating the SOI semiconductor device shown in FIG. 2.

DETAILED DESCRIPTION OF PREFERRED EMBODIMENTS OF THE INVENTION

Figure 2:
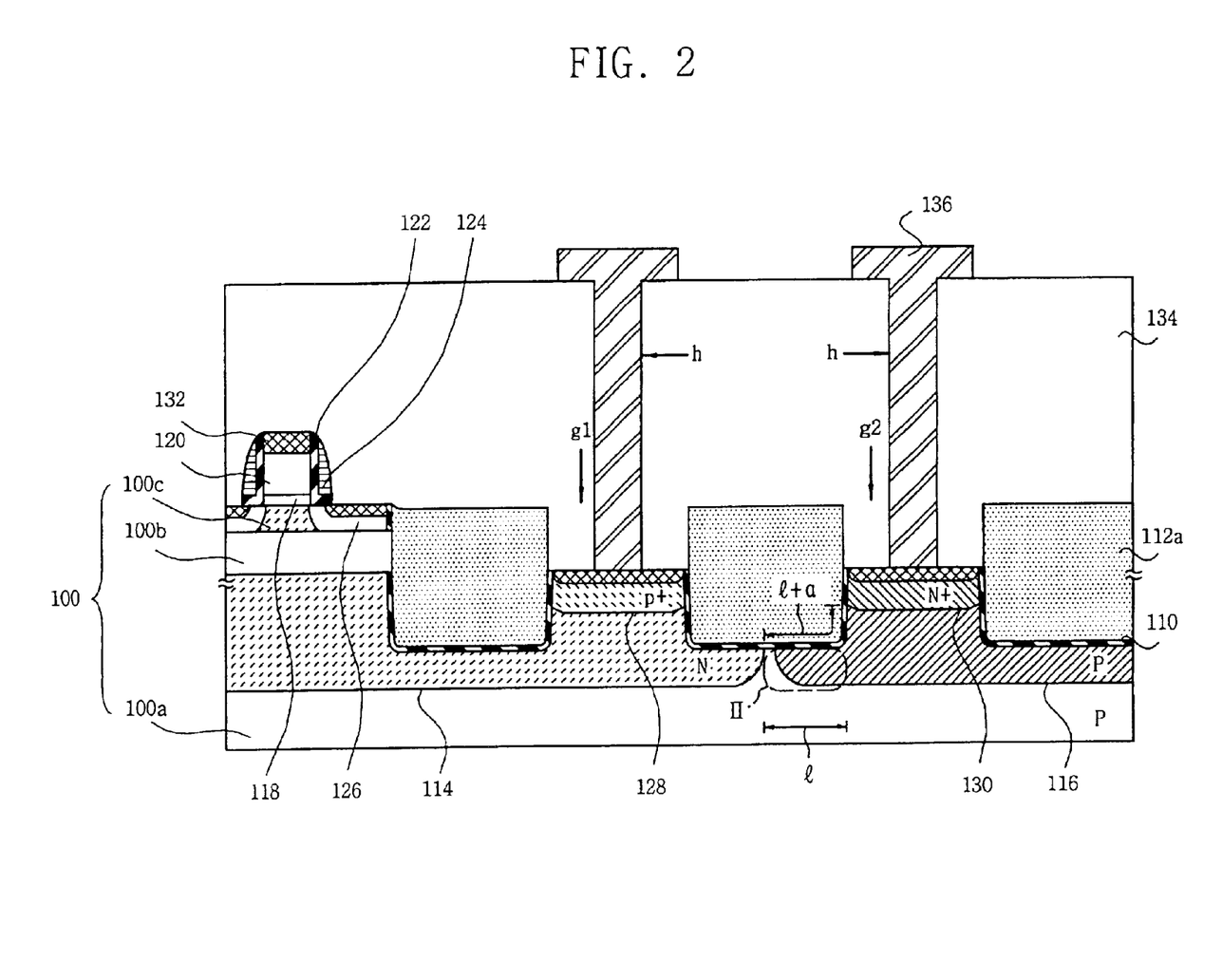
FIG. 2 is a cross-sectional view illustrating a SOI semiconductor device in accordance with one embodiment of the present invention.

FIG. 2 is a cross-sectional view illustrating one embodiment of a SOI semiconductor device in accordance with the present invention. With reference to the cross-sectional view of the SOI device shown in FIG. 2, the structure of the SOI device will be described in detail below. A semiconductor device having diodes will be described as an embodiment of the present invention.

As shown in FIG. 2, the 50I device of the present invention is constructed with a SOI substrate 100. A surface silicon layer 10c is formed by inserting an insulating layer 10b over a P-type semiconductor substrate 100a. A trench forming an element separating region is formed at a predetermined internal portion of the SOI substrate 100 by etching a portion of surface silicon layer 100a, insulating layer 100b and the semiconductor substrate. A STI 112a formed in the trench (t). A gate electrode 120 is formed on the surface silicon layer 100c surrounded by the insulating layer 100b and STI. A source/drain region 126 is formed in the surface silicon layer 100c at both edges of the gate electrode 120 with its bottom part being in contact with the insulating layer. A first groove (g1) is formed at one side of the gate electrode 120 by etching the surface silicon layer and insulating layer to expose an active region of a N well 114 formed in the semiconductor substrate. A P+ type first diffusion region 128 is formed in the N well 114 under the first groove. A second groove (g2) is formed at one side of the first diffusion region 128 by etching the surface silicon layer 100c and insulating layer 100b to expose an active region of the P well 116 formed in the semiconductor substrate 100a. A N+ type second diffusion region 130 is formed in the P well 116 under the second groove (g2). An interlevel insulating layer 134 is formed having a plurality of contact holes (h) to respectively expose predetermined portions of the surface of the gate electrode 120, source/drain region 126 and the first and second diffusion regions. A plurality of metal wires 136 are formed at the insulating layer 134 for separately connecting through the contact holes (h) with these unit elements.

In FIG. 2, reference numerals 122, 132 and 110 respectively indicate an oxide or nitride layer of a spacer, silicide layer formed for preventing the voltage of gate electrode and contact wires from dropping, and an oxide layer formed along a bordering line between STI 112a and semiconductor substrate 100a.

The surface silicon layer 100c surrounded by insulating layer 100b and STI 112a is used for the channel region of a PMOS transistor made up of gate electrode 120 and source/drain region 126. The first and second diffusion regions 128, 130 are electrically insulated, specifically, the first diffusion region 128 and N well 114 are a P+/N diode, and the second diffusion region 130 and P well 116 are a N+/P diode.

In the embodiment of the present invention thus constructed, the SOI device is constructed with both an N well 114 and a P well 116. However, it is not necessary to include a step of forming the P well 116 because the semiconductor substrate 100a itself is P type. It is possible to form another P type impurity doping region (not shown) at a predetermined part under the STI 112a that contacts the N well 114, not the P well 116, for the purpose of enhancing the insulation property of the first and second diffusion regions 128, 130. If necessary, the semiconductor device can also be designed to include these two elements (P well and P type impurity doping region) in the semiconductor device.

The SOI device thus constructed can be fabricated in the following operational steps as shown in the drawings for illustrating sequential processes in FIGS. 3a through 3l.

Figure 3A:
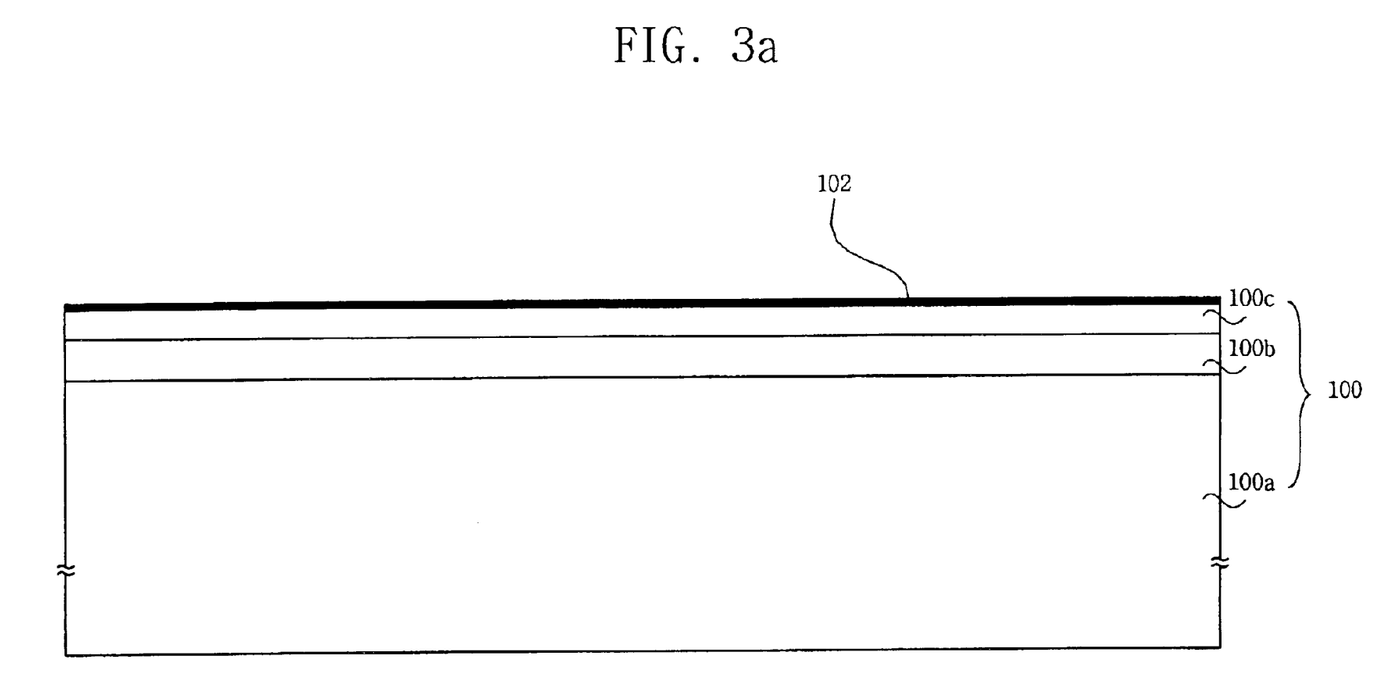

As shown in FIG. 3a, a SOI substrate 100 is constructed in the composition structure of a P-type surface silicon layer 100c, an oxide layer of the insulating layer and a P-type semiconductor substrate 100a. A thin buffer layer 102 is formed on the substrate 100 by an oxidation process.

Figure 3B:
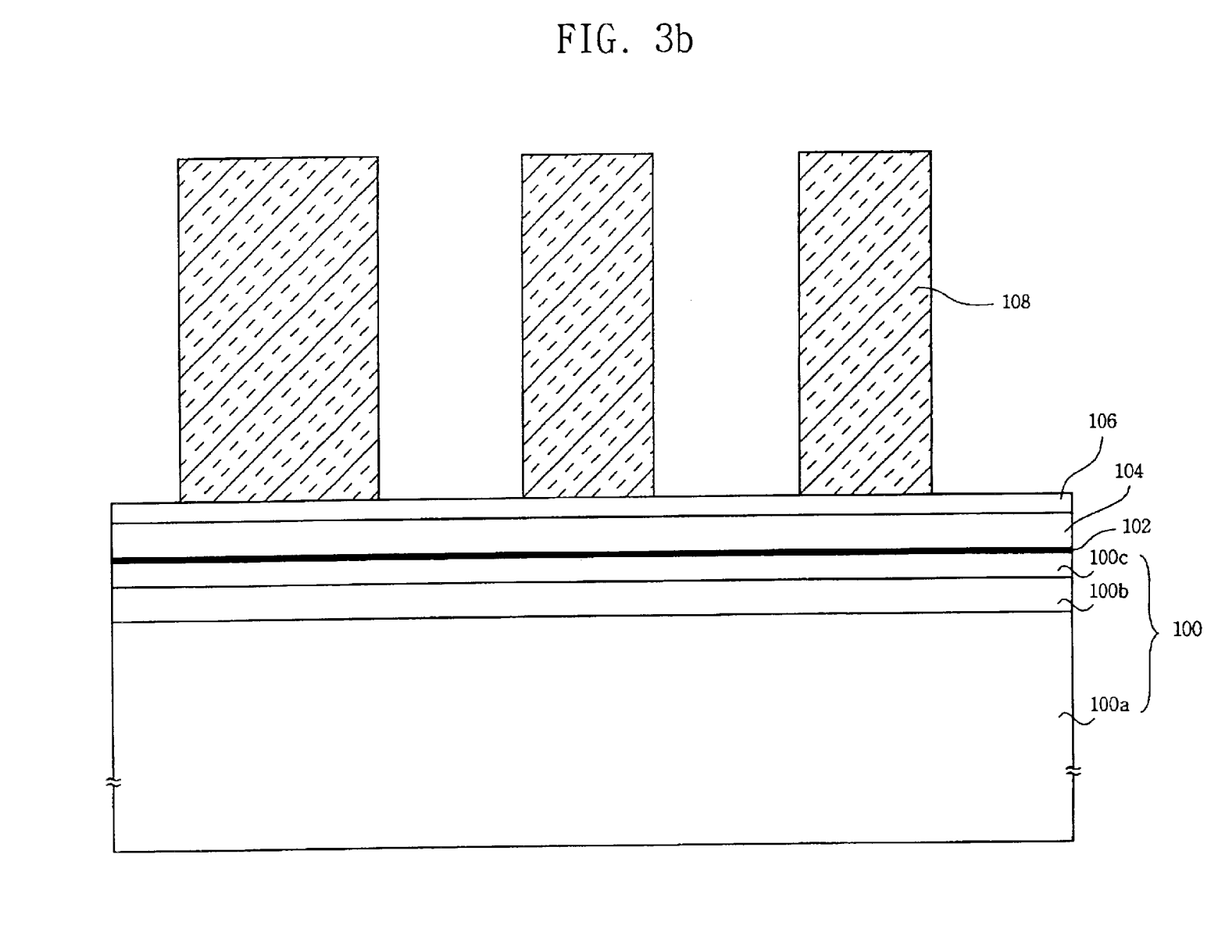

As shown in FIG. 3b, after an etch stopper layer of a nitride layer 104 and an oxide layer 106 are sequentially deposited on the buffer layer 102, a pattern of photo resist layers 108 defining an active region is formed on the oxide layer 106.

Figure 3C:
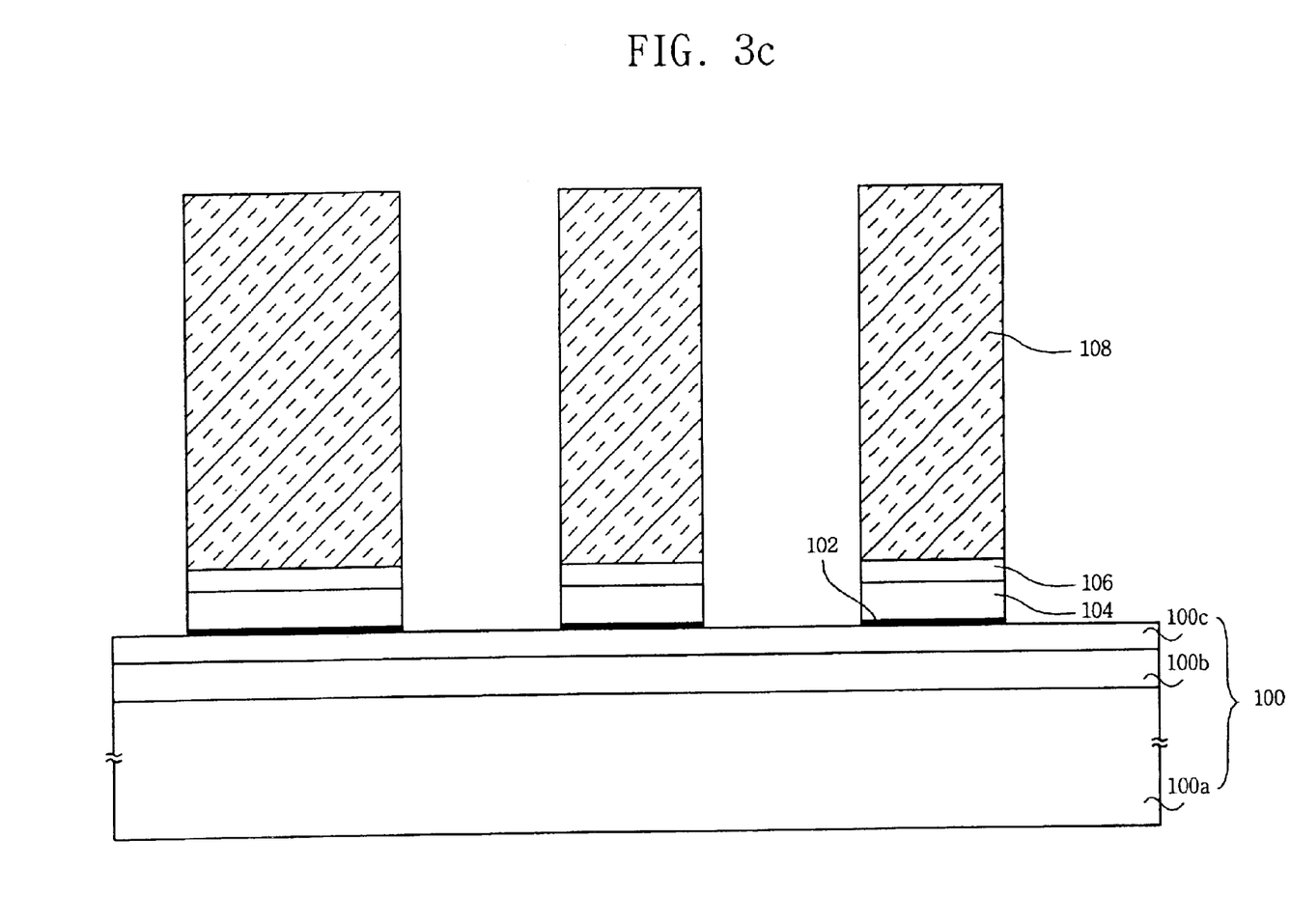

As shown in FIG. 3c, the pattern of photo resist layers 108 is used as a mask for sequentially etching oxide layer 106, etch stopper layer 104 and buffer layer 102.

Figure 3D:
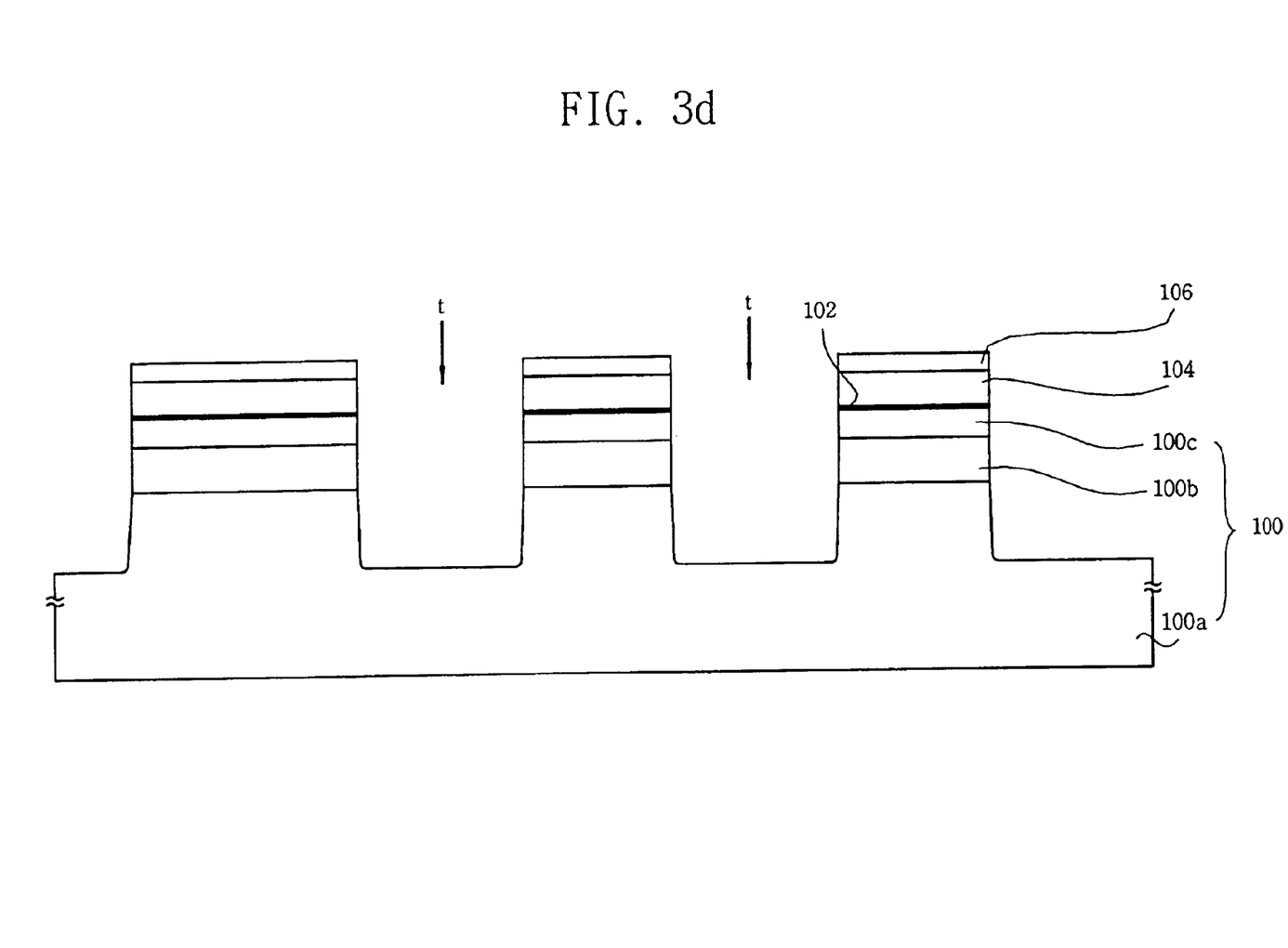

As shown in FIG. 3d, the pattern of photo resist layers 108 is removed, and the etched oxide layer 106 is used as a mask for simultaneously performing a dry etching process to surface silicon layer 100c, insulating layer 100b and semiconductor substrate 100a under the buffer layer 102, thereby forming trenches (t) of a predetermined depth. At this time, the pattern of photo resist layers 108 may be removed after completion of trenches (t), not before formation of trenches (t).

Figure 3E:
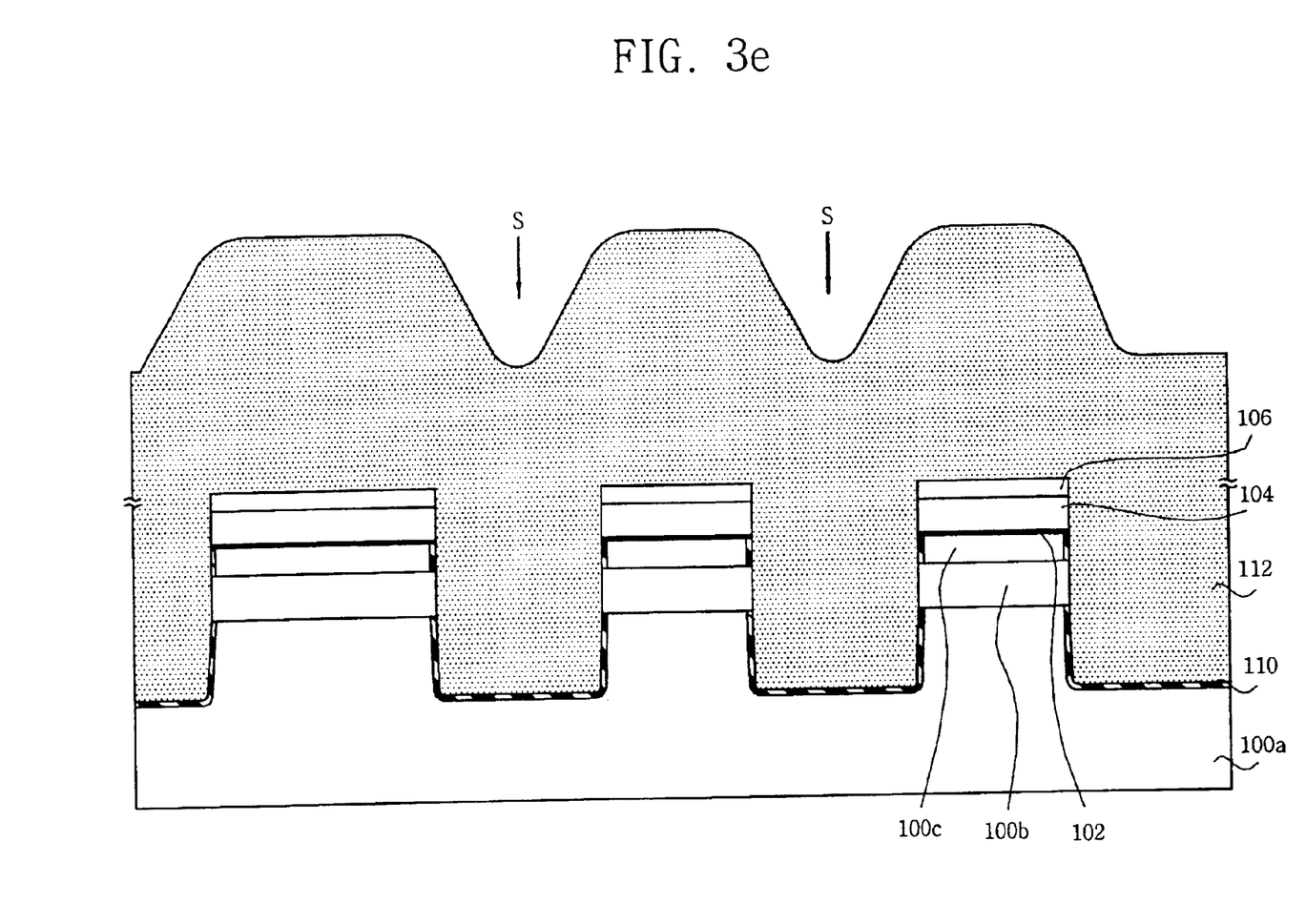

As shown in FIG. 3e, an oxidation process is performed to cure any damage made on the SOI substrate 100 in the process of forming trenches (t), so that a thin first oxide layer 110 is formed along the exposed part of the surface of semiconductor substrate 100a and surface silicon layer 100c. Then, an insulating layer 112 is formed over the resultant structure to fill up the trenches. A mono-layered or multi-layered deposition structure of PTEOS, USG, SIN, HDP and the like can be used as the insulating layer 112.

Figure 3F:
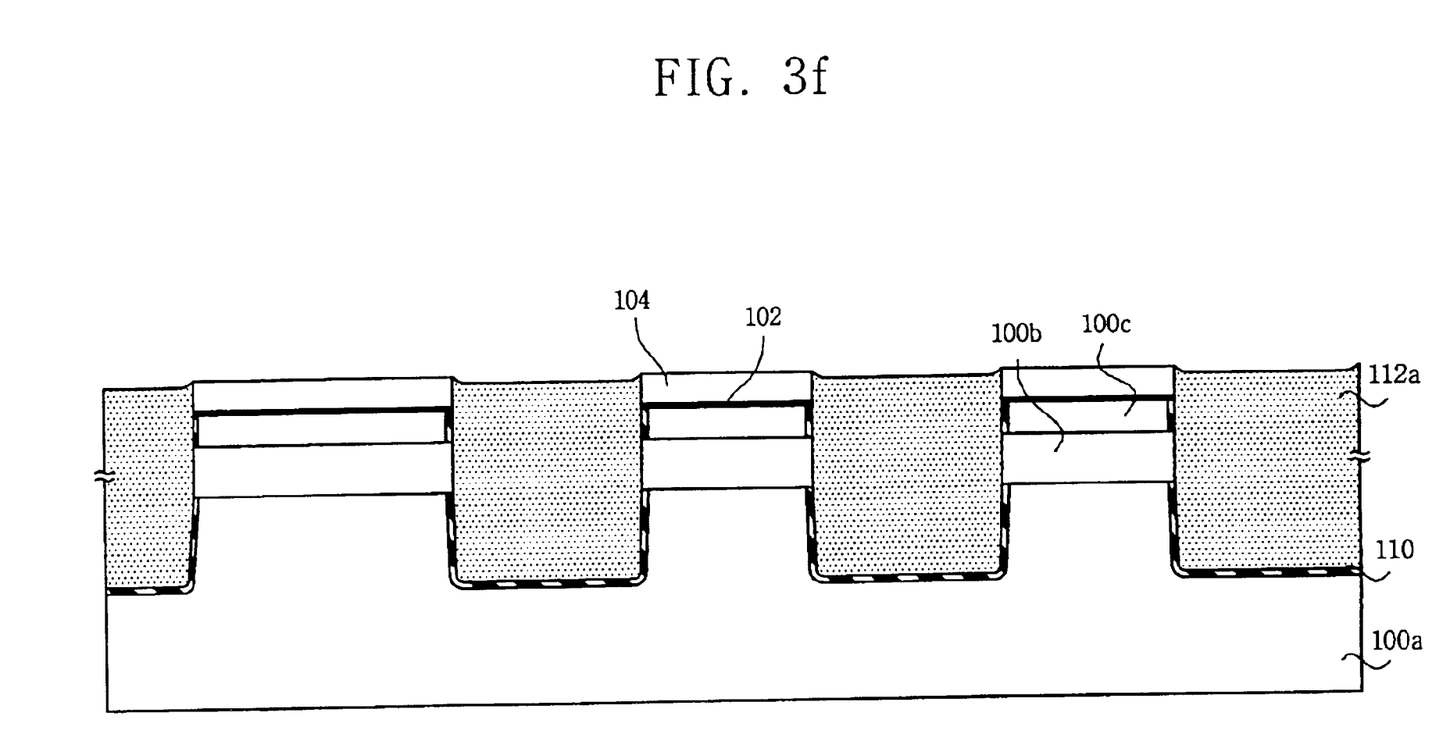

As shown in FIG. 3f, CMP treatment is performed to the insulating layer 112 to leave a predetermined thickness of etch stopper layer 104 on the buffer layer 102, thereby forming a STI 112a in the trenches (t). At this time, the CMP treatment of the insulating layer 112 may also be performed after the step coverage parts (s) are selectively filled with a photo resist layer to make the layers even.

Figure 3G:
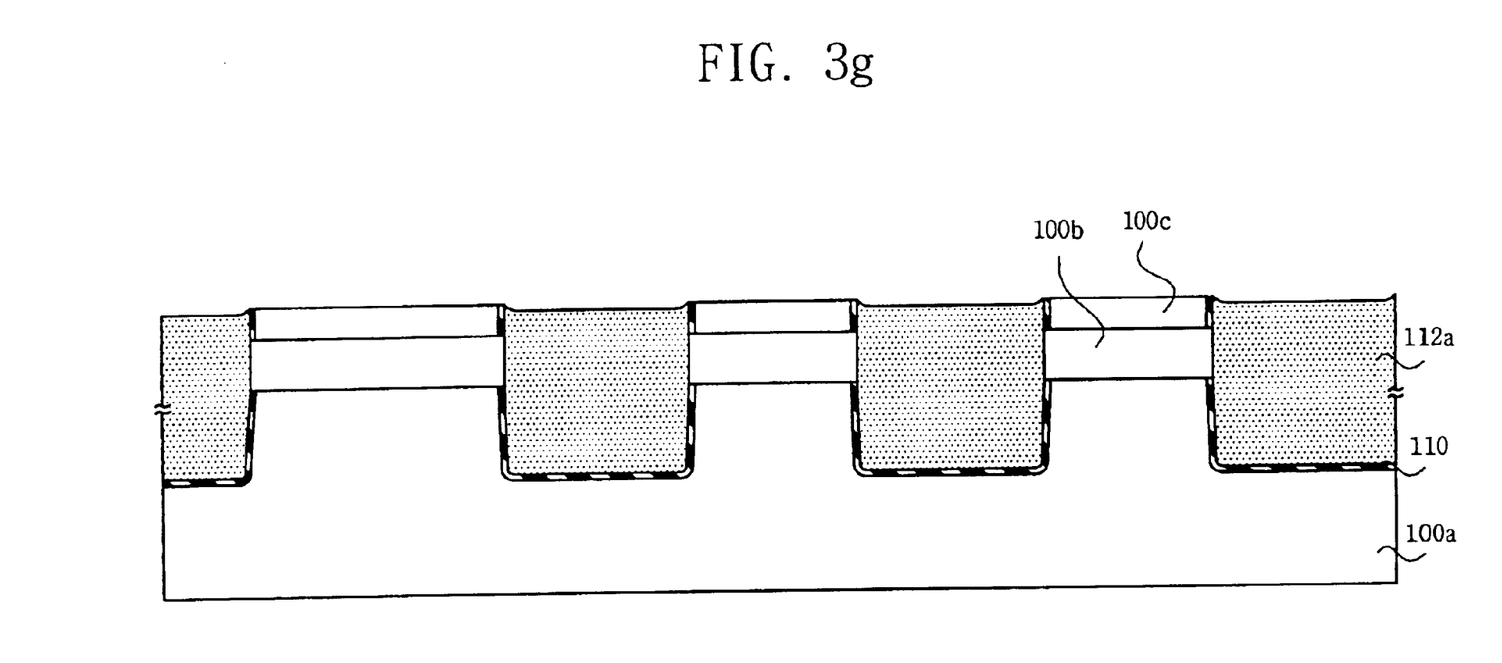

As shown in FIG. 3g, after the remaining etch stopper layer 104 is removed by phosphoric acid as an etchant, the buffer layer 102 is removed. In this process, the small quantity of the STI 112a may be etched out not to be taken into consideration.

Figure 3H:
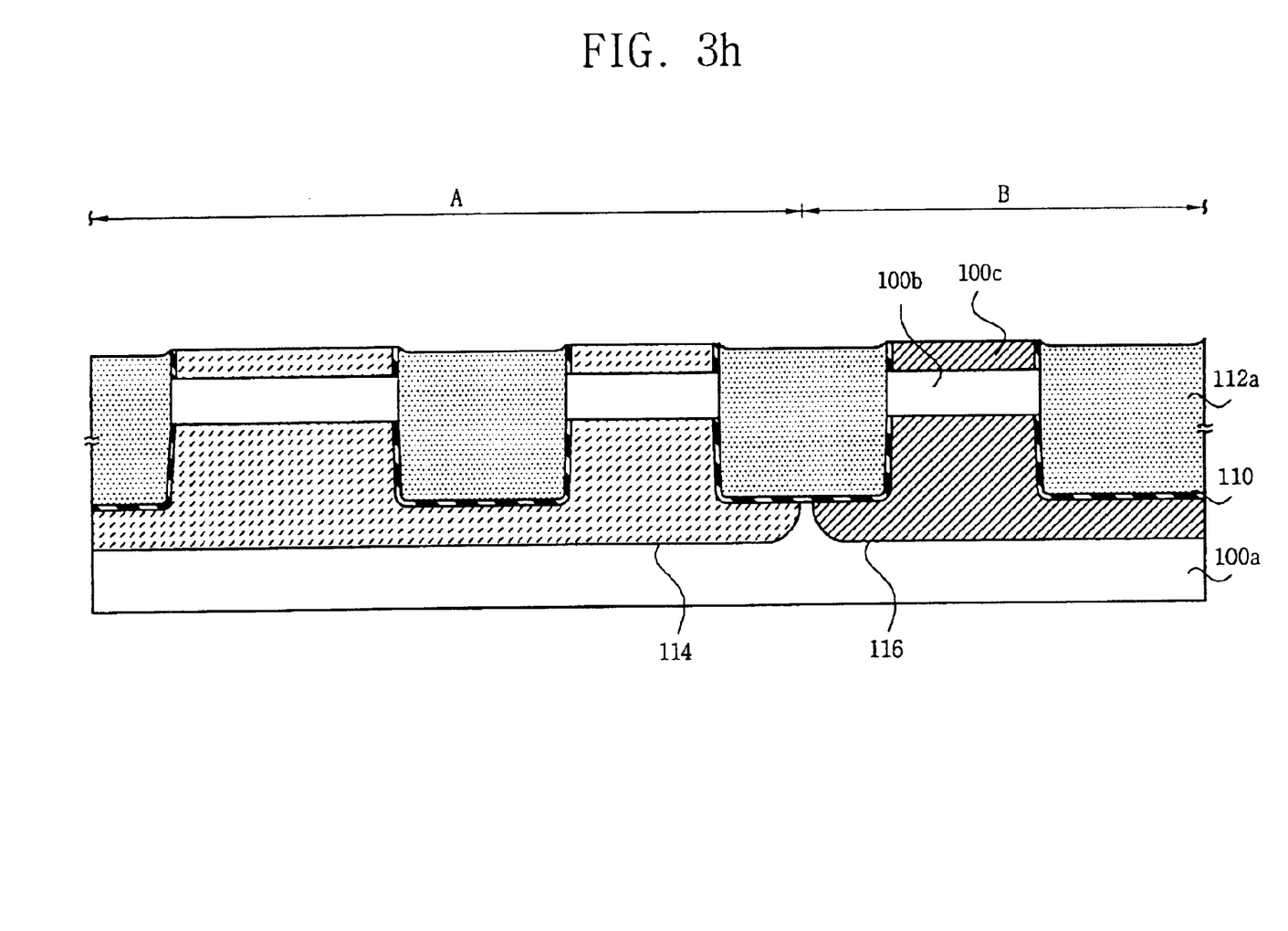

As shown in FIG. 3h, while an NMOS transistor forming part (B) is masked, N type impurity is ion-implanted to the structure, so that the internal part of the surface silicon layer 100c positioned at a PMOS transistor forming part (A) is doped with N type impurity and, at the same time, an N well 114 is formed in the semiconductor substrate 100a under the surface silicon layer 100c. Then, while the PMOS transistor forming part (A) is masked, P type impurity is ion-implanted to the resultant structure, so that the internal part of the surface silicon layer 100c positioned at an NMOS transistor forming part (A) is doped with P type impurity and, at the same time, a P well 114 is formed in the semiconductor substrate 100a under the surface silicon layer 100c. At this time, in order to evenly dope N and P type impurity into the surface silicon layer 100c and the semiconductor substrate 100a, the ion-implantation with impurity should be carried out twice or three times (surface ion-implantation, deep ion-implantation). Furthermore, a field ion-implantation process can also be additionally performed after formation of the P well 116 for the purpose of enhancing the insulating property of the STI 112a, so that P type impurity doping regions can also be formed to contact the second conductivity type well 114 at a predetermined part (designated by reference symbol II) under the STI 112*a* between N well 114 and P well 116. If necessary, the field ion-implantation can be performed to form only the P type impurity doping region (not shown) instead of P well 116, immediately after formation of N well 114.

Figure 3I:
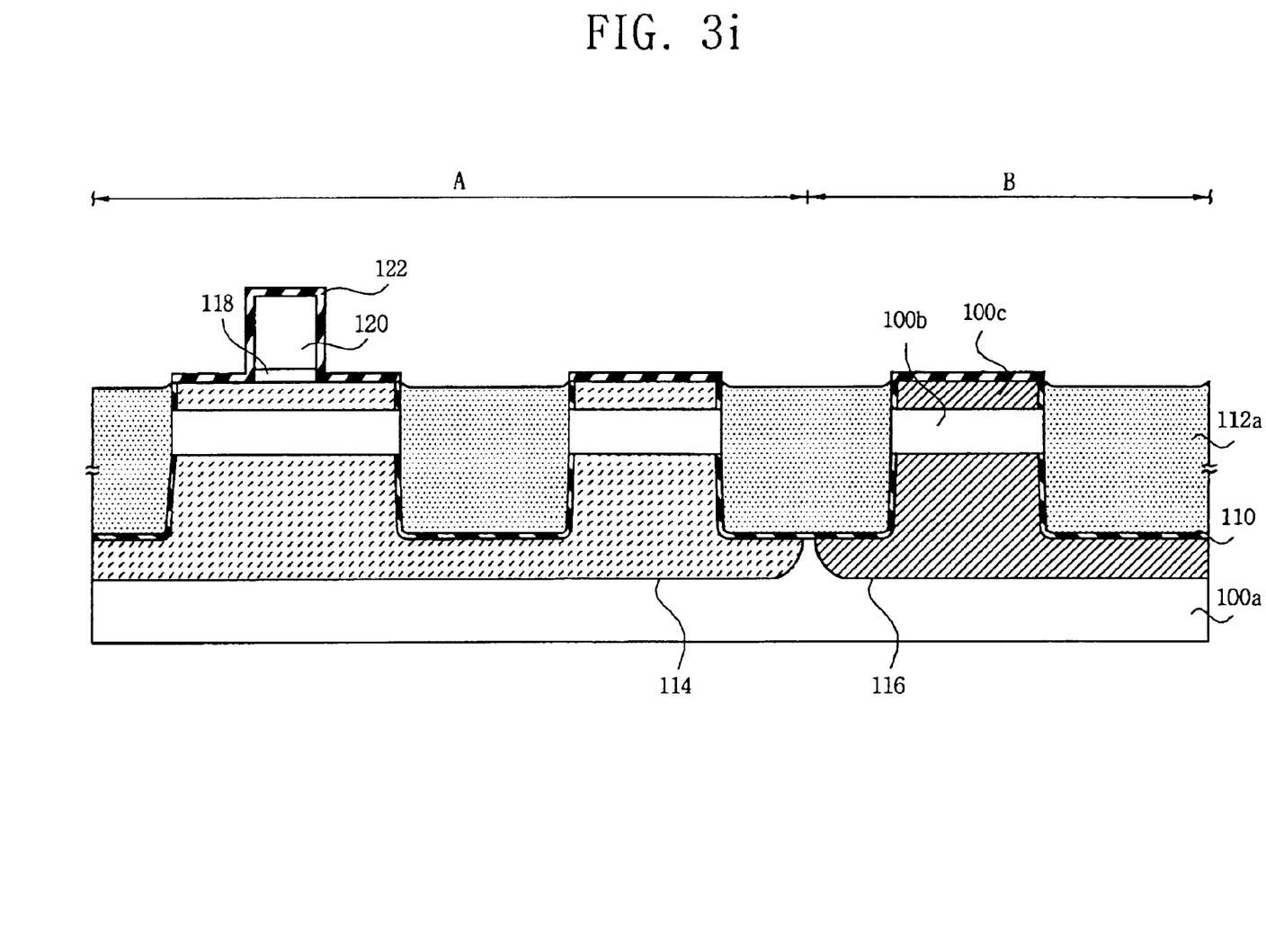

As shown in FIG. 3*i*, a gate insulating layer 118 is formed onto the surface silicon layer 110*c* of the PMOS transistor forming part (A) to form a polysilicon gate electrode 120, and, then, an oxidation process is performed to form a thin second oxide layer 122 on the surface silicon layer 100*c* having the gate electrode 120.

Figure 3J:
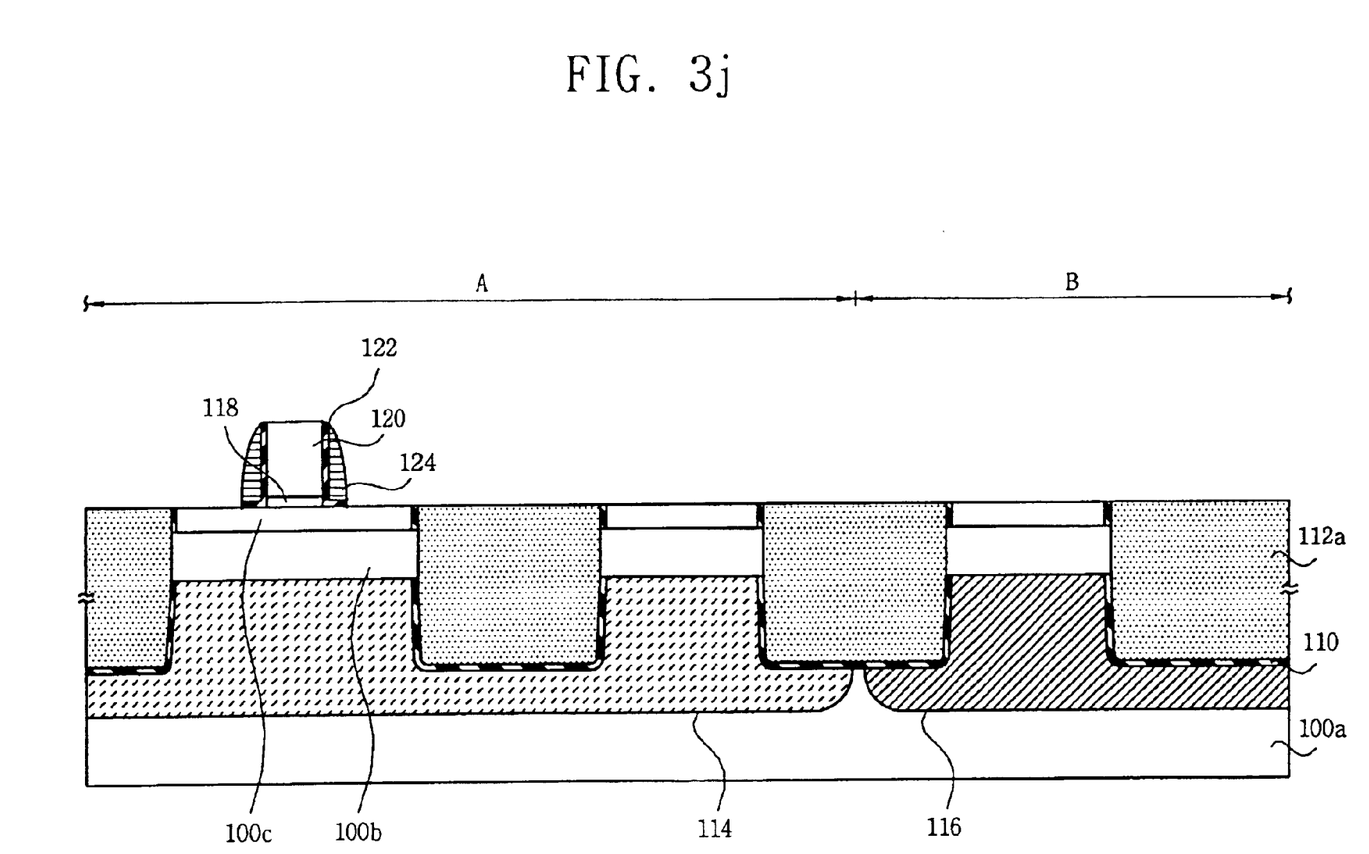

As shown in FIG. 3*j*, an insulating layer of oxide or nitride layer is formed on the resultant structure, and, then, a two-directional dry etching process is performed to form insulating spacers at both lateral walls of the gate electrode 120. As a part of the second oxide layer 122 is etched out in this process, the top surface of the gate electrode 120 and the surfaces of N well 114 and P well 116 positioned under the first and second grooves (g1) (g2) are exposed after the dry etching process.

Figure 3K:
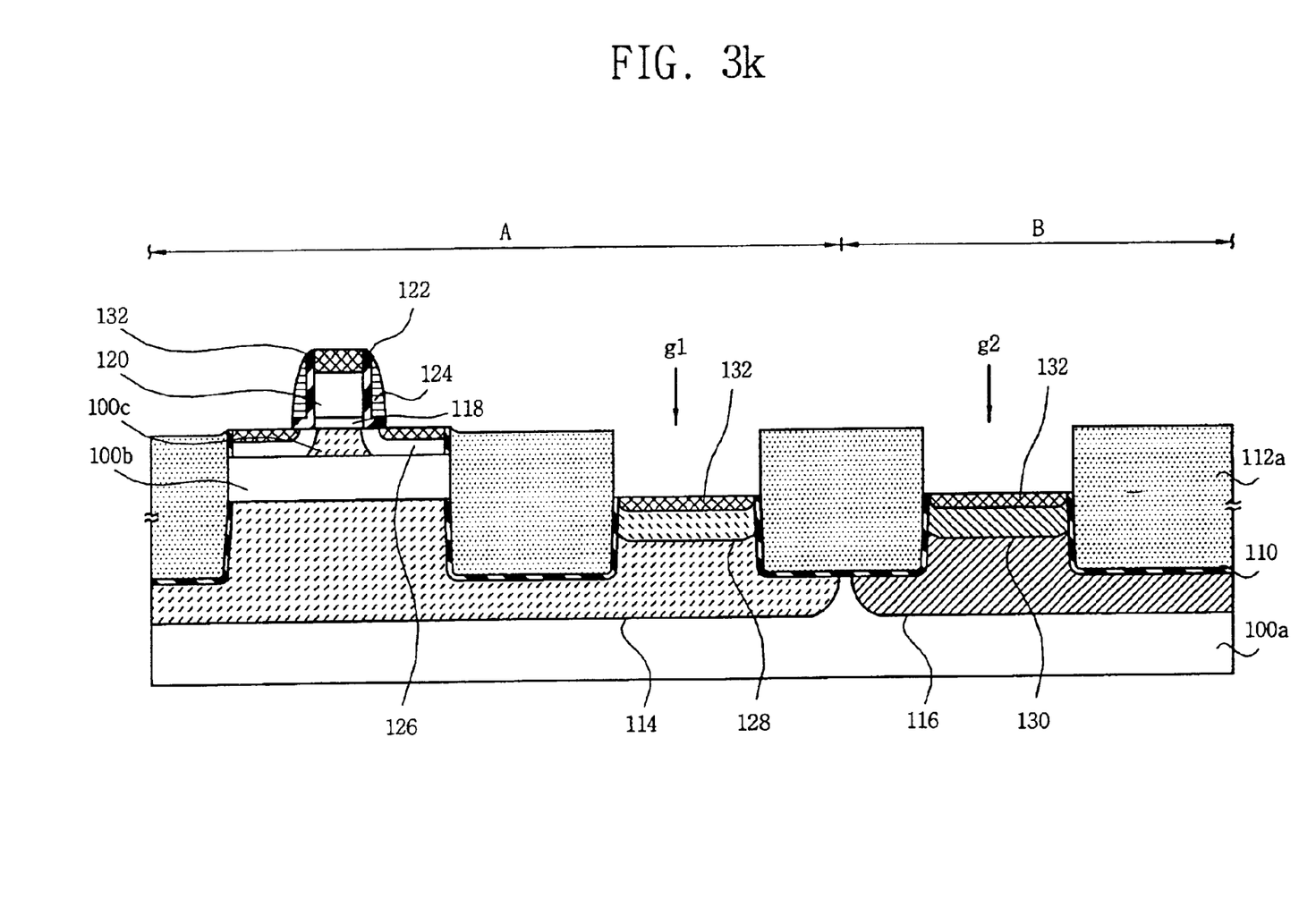

As shown in FIG. 3*k*, in order to expose some predetermined parts of the active region of N well 114 and P well 116 formed in the semiconductor substrate 100*a*, the pattern of photo resist layers restricting a diode forming part is used as a mask to selectively etch predetermined parts of surface silicon layer 100*c* and insulating layer 100*b*. As a result, a first groove (g1) is formed to expose the surface of the N well 114 at one side of the gate electrode 120 of the STI 112*a*. The second groove (g2) is formed next to the STI 112*a* at one side of the first groove (g1) to expose the surface of the P well 116. Then, after the NMOS transistor forming part (B) is masked, a high density P type impurity is ion-implanted onto the resultant structure to form a P type source/drain region 126 in the surface silicon layer 100*c* at both edges of the gate electrode 120 and a P type first diode diffusion region 128 in the N well 114 under the first groove (g1). Likewise, after the PMOS transistor forming part (A) is masked, a high density N type impurity is ion-implanted onto the resultant structure to form a N type source/drain region (not shown) in the surface silicon layer 100*c* at both edges of the gate electrode (not shown) and an N type second diode diffusion region 130 in the P well 116 under the second groove (g2). In order to keep low voltage of the gate electrode 120 and contact wires to be formed later, silicide layers 132 are self-aligned onto the first and second diffusion regions 128, 130 that includes the gate electrode 120 and source/drain region 126.

As shown in FIG. 3*l*, an interlevel insulating layer 134 is formed over the resultant structure. A plurality of contact holes (h) are formed by selectively etching some predetermined parts of the interlevel insulating layer 134 to expose the surface of gate electrode 120, source/drain region 126, first diffusion region 128 and second diffusion region 130. A plurality of contact wires 136 are formed on the insulating layer 134 to separately connect the unit elements, thereby completing all the processes of fabricating the SOI device. In one embodiment, the contact wires 136 are made of Al or Cu alloys.

If the SOI device shown in FIG. 2 is fabricated by the aforementioned processes, the first and second diffusion regions 128, 130 of the device are designed to be insulated by the STI 112*a* in the semiconductor substrate 100*a*. Even if the N well 114 to form the P+/N diode and the second diffusion region 130 to form an N+/P diode are designed to be separated by length l, the actual distance for separation, that is, the effective distance for separation, can be secured as l+. Therefore, even if the distance between those diodes in the present invention is shorter than that in the prior art, there will be no reduction in the operational characteristic of the SOI device, for example, there will be no reduction in its insulating characteristic.

In addition, the SOI device of the present invention having the same functional capacity as the conventional SOI device can be fabricated in an area smaller than that required for the integrated circuit of the conventional SOI device, thereby achieving a highly integrated semiconductor device and making it possible to apply the aforementioned fabricating method in accordance with the design rules of fabricating the semiconductor device.

The technique described herein as relating to formation of diodes can also be applied to fabrication of other unit elements like a well type resistor for electronic circuits.

As described above, there are advantages in the SOI device of the present invention in that the P+/N diode and N+/P diode are separated by STI in the semiconductor substrate to reduce a distance between those diodes without any reduction in its insulating property by securing a longer effective distance between the N well forming the P+/N diode and N+type diffusion region forming the N+/P diode in spite of its shorter distance between those diodes.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method for fabricating a SOI semiconductor device comprising:

forming a surface silicon layer on a semiconductor substrate of a first conductivity type by inserting an insulating layer on the semiconductor substrate;

sequentially forming an etch stopper layer and an oxide layer on the surface silicon layer;

selectively etching the oxide layer and the etch stopper layer to expose a predetermined portion of the surface silicon layer to be used for an element separating region;

forming a trench using the etched oxide layer as a mask to sequentially etch a predetermined thickness of surface silicon layer, insulating layer and semiconductor substrate;

sequentially forming an insulating layer to fill the trench and a STI formed in the trench by performing a CMP treatment such that the etch stopper layer is at a predetermined thickness;

removing the remaining etch stopper layer;

doping a predetermined portion of an inner part of the surface silicon layer by selectively ion-implanting a second-conductivity-type impurity to form a first transistor and simultaneously form a second-conductivity-type well in the semiconductor substrate thereunder;

forming a gate electrode by forming a gate insulating layer on the surface silicon layer at the top of the second-conductivity-type well;

forming spacers at both lateral walls of the gate electrode;

forming first and second grooves by selectively etching the surface silicon layer and insulating layer to expose the surface of the second-conductivity-type well at one side of the gate electrode and that of the semiconductor substrate, both of which are positioned apart at a predetermined distance with the STI being formed therebetween;

forming a source/drain region in the surface silicon layer at both edges of the gate electrode by selectively ion-implanting a high density of the first-conductivity-type impurity where a first transistor is formed, the bottom portion of said source/drain region contacting the insulating layer, and forming a first diode diffusion region in the second-conductivity-type well under the first groove; and forming a second diode diffusion region in the semiconductor substrate under the second groove by selectively ion-implanting a high density of the second-conductivity-type impurity into a part to form a second transistor.

2. The method, as defined in claim 1, wherein the etch stopper layer is made of a nitride layer.

3. The method, as defined in claim 1, further comprising, after formation of the trench, forming a first oxide layer along a line internally bordering the trench by an oxidation process.

4. The method, as defined in claim 1, further comprising, after formation of an insulating layer over the resultant structure to sufficiently fill up the trench, selectively filling up a step coverage forming part with photo resist layer.

5. The method, as defined in claim 4, wherein the insulating layer is formed in a mono-layered or multi-layered deposition structure of PTEOS, USG, SIN and HDP.

6. The method, as defined in claim 1, wherein the etch stopper layer is removed by a wet etching process with phosphoric acid as an etchant.

7. The method, as defined in claim 1, further comprising, after formation of the second-conductivity-type well, selectively ion-implanting the first-conductivity-type impurity only at a part of the resultant structure, where a second transistor is formed, to dope a first-conductivity-type impurity at a predetermined internal part of the surface silicon layer and simultaneously form a first-conductivity-type well in the semiconductor substrate thereunder.

8. The method, as defined in claim 7, further comprising, after formation of the first conductivity type well, forming a first-conductivity-type impurity doping region to contact the second-conductivity-type well at a predetermined part under the STI between the first-and second-conductivity-type wells.

9. The method, as defined in claim 1, further comprising, after formation of the second conductivity type well, forming a first-conductivity-type impurity doping region to contact the second-conductivity-type well at a predetermined part under the STI between the second-conductivity-type well and the second diode diffusion region.

10. The method, as defined in claim 1, further comprising, after formation of the gate electrode, forming a second oxide layer on the gate electrode and surface silicon layer by an oxidation process.

11. The method, as defined in claim 1, wherein forming spacers further comprises:

forming an insulating layer over the resultant structure having the gate electrode; and performing a two-directional dry etching process to the insulating layer to expose the surface silicon layer.

12. The method, as defined in claim 11, wherein the insulating layer is made of oxide or nitride layer.

13. The method, as defined in claim 1, wherein the first transistor is a PMOS transistor.

14. The method, as defined in claim 1, wherein the second transistor is a NMOS transistor.

15. The method, as defined in claim 1, wherein, after formation of the second diode diffusion region, a silicide layer is formed on the gate electrode, the source/drain region and the first and second diode diffusion region.

* * * * *